(12) United States Patent
Tsai et al.

(10) Patent No.: US 11,314,296 B2
(45) Date of Patent: Apr. 26, 2022

(54) COMPUTER DEVICE INNER PANEL HAVING DIFFERENT OPENING ARRAYS

(71) Applicant: Hewlett-Packard Development Company, L.P., Spring, TX (US)

(72) Inventors: Chia-Ming Tsai, Taipei (TW); Cheng-Han Tsai, Taipei (TW); John J. Groden, Spring, TX (US); Hui Leng Lim, Spring, TX (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 17/046,085

(22) PCT Filed: Oct. 26, 2018

(86) PCT No.: PCT/US2018/057691
§ 371 (c)(1),
(2) Date: Oct. 8, 2020

(87) PCT Pub. No.: WO2020/086093
PCT Pub. Date: Apr. 30, 2020

(65) Prior Publication Data
US 2021/0240238 A1 Aug. 5, 2021

(51) Int. Cl.
*G06F 1/20* (2006.01)
*H05K 7/20* (2006.01)
(52) U.S. Cl.
CPC ........... *G06F 1/20* (2013.01); *H05K 7/20145* (2013.01); *H05K 7/20209* (2013.01)

(58) Field of Classification Search
CPC ........ G06F 1/20; H05K 7/20; H05K 7/20145; H05K 7/20181; H05K 7/20209; H05K 9/0018; H05K 9/0041; H05K 9/0088
See application file for complete search history.

(56) References Cited

U.S. PATENT DOCUMENTS

| | | | |
|---|---|---|---|
| 6,342,004 B1 * | 1/2002 | Lattimore | A62C 2/245 169/48 |
| 7,184,278 B2 | 2/2007 | Tsai | |
| 7,826,213 B2 * | 11/2010 | Peng | H05K 7/1487 361/679.46 |
| 8,218,313 B2 | 7/2012 | Cheng et al. | |
| 8,369,084 B2 | 2/2013 | Chen et al. | |

(Continued)

FOREIGN PATENT DOCUMENTS

CN 107748608 3/2018

*Primary Examiner* — Jacob R Crum
(74) *Attorney, Agent, or Firm* — HPI Patent Department

(57) ABSTRACT

An example computing device may include a housing having an outer panel, the outer panel comprising a first array of openings through the outer panel, an inner panel opposite the outer panel, the inner panel comprising a second array of openings and a third array of openings different than the second array of openings and an actuator to move the inner panel relative to the outer panel between (1) a first position in which the second array of openings are at least partially aligned with the first array of openings and the third array of openings are out of alignment with the first array of openings, and (2) a second position in which the third array of openings are at least partially aligned with the first array of openings and the second array of openings are out of alignment with the first array of openings.

15 Claims, 6 Drawing Sheets

(56) References Cited

U.S. PATENT DOCUMENTS

| | | | | |
|---|---|---|---|---|
| 8,546,703 | B2* | 10/2013 | Tang | H05K 5/0213 |
| | | | | 174/547 |
| 9,907,202 | B2 | 2/2018 | Li | |
| 2008/0112129 | A1* | 5/2008 | Kuo | G06F 1/20 |
| | | | | 361/679.46 |
| 2010/0167636 | A1 | 7/2010 | Bhattacharya et al. | |
| 2012/0075803 | A1* | 3/2012 | Kobayashi | H05K 7/20145 |
| | | | | 361/695 |
| 2012/0130545 | A1 | 5/2012 | Haugh et al. | |
| 2012/0188713 | A1* | 7/2012 | Chen | G06F 1/20 |
| | | | | 361/688 |
| 2016/0249123 | A1 | 8/2016 | Lee et al. | |
| 2018/0217644 | A1 | 8/2018 | Dan et al. | |

* cited by examiner

COMPUTER DEVICE INNER PANEL HAVING DIFFERENT OPENING ARRAYS

BACKGROUND

Computing devices include processors and other electronic components that generate heat. Such heat may harm or damage components of the computing devices. Some computing devices include vents through which heat is expelled from the computing device.

Figure 1A:
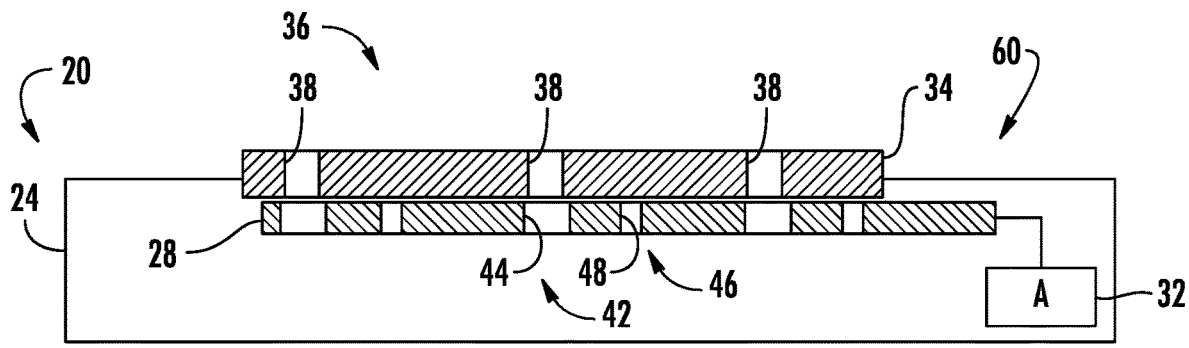
FIG. 1A is a sectional view schematically illustrating portions of an example computing device with an inner panel having openings in a first venting position.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION OF EXAMPLES

Disclosed herein are example computing devices, methods and inner panels that provide multiple different airflow options for venting the interior of a computing device to accommodate different environments, different cooling demands and different aesthetic preferences. The example computing devices, methods and inner panels provide user initiated or automatic selection from amongst multiple venting states to provide desired cooling, reduce dust ingress and enhance aesthetics. The disclosed computing devices, methods and inner panels utilize an inner panel having multiple different arrays of openings which are each selectively positionable into and out of alignment with openings of an outer panel of a housing of the computing device.

For purposes of this disclosure, the term "alignment" of an opening or array encompasses partial alignment where one opening at least partially overlaps another opening, full or complete alignment wherein one opening is coextensive with another opening or wherein one opening is completely within the other opening, or centered alignment wherein one opening has a center point coinciding with a center point of the other opening. For purposes of this disclosure, an array of openings is "different" when two different arrays each have different characteristics as compared to one another. Such different characteristics may include differently sized openings, differently shaped openings, filtered versus unfiltered openings, openings having different interior passage shapes, openings having different paths, a different layout or arrangement of the openings and/or a different density of individual openings or collective opening area per surface area.

In some implementations, the actuator comprises a magnet, such as a selectively actuatable electromagnet and a second magnet or a magnet attractable material, wherein magnetic forces between the magnets or between the magnet and the magnet attractable material are utilized to move the inner panel to selectively position different arrays of openings of the inner panel in alignment with the openings in the outer panel of the housing. In one implementation, each of different positions of the inner panel are associated with a dedicated electromagnet which is controllably actuated to control the positioning of the inner panel in one of the selected positions. In other implementations, magnetic forces may work against a bias, such as a spring or the like, page page to reposition the inner panel relative to the outer panel.

In one implementation, positioning of the inner panel relative the outer panel is controlled by a controller that sends control signals to the actuator. The controller may output such control signals based upon commands received from a user input. In a different mode of operation, controller may automatically output control signals to the actuator to reposition the inner panel. Such automatic repositioning of the panel may be in response to a sensed temperature within the housing of the computer device, a sensed temperature of a specific heat generating component, such as a processor, within the housing, the output or detected state of the heat generating component and/or the output or detected state of other components within the housing, such as a fan. In such implementations, the alignment and the selection of what openings are positioned opposite to the openings of the outer panel may be controlled so as to provide the largest number or area of collective passages through the inner and outer panel when high degrees of cooling are used to address higher temperatures and to provide a fewer number of openings or a smaller area of collective passages through the inner and outer panel when lower degrees of cooling are desired. By reducing the size of the passages through the inner and outer panels when lower degrees of cooling are provided, the degree to which dust and other airborne contaminants may enter the interior of the housing may be reduced. In addition, the aesthetic appearance of the housing and of the computer device itself may be enhanced.

In some implementations, the housing facilitates the removal and exchange of inner panels. For example, in some implementations, the housing may include an access opening and the inner panel may releasable so as to be withdrawn through the access opening. Following this removal, a replacement inner panel may be inserted through the access opening. The replacement inner panel may have different characteristics as compared to the removed initial inner panel. The inner panel may have a different color, design, pattern or the like to enhance the aesthetic appearance of the heating device as those portions of the inner panel may be seen through the openings of the outer panel. Inner panel may offer additional alternatives for the array of openings alignable with the openings of the outer panel to further address different operating conditions and cooling demands.

Disclosed herein is an example computing device that may include a housing having an outer panel, the outer panel comprising a first array of openings through the outer panel, an inner panel opposite the outer panel, the inner panel comprising a second array of openings and a third array of openings different than the second array of openings and an actuator to move the inner panel relative to the outer panel between (1) a first position in which the second array of openings are at aligned with the first array of openings and the third array of openings are out of alignment with the first array of openings, and (2) a second position in which the third array of openings are aligned with the first array of openings and the second array of openings are out of alignment with the first array of openings.

Disclosed herein is an example method may involve movably supporting an inner panel relative to an outer panel of a computing device housing, the outer having a first array of openings, moving the inner panel to a first position relative to the outer panel to position a second array of openings in alignment with the first array of openings and moving the inner panel to a second position relative to the outer panel to position a third array of openings, different than the second array of openings, in alignment with the first array of openings.

Disclosed herein is an example inner panel for a computing device housing. The Example inner panel may include a first array of openings through the inner panel and a second array of openings extending through the inner panel and distributed amongst the first array of openings. The second array of openings is different than the first array of openings.

FIG. 1A is a sectional view schematically illustrating portions of an example computing device 20. Computing device 20 may have a variety of forms and specific functions in addition to providing a computation or processing of data. Computing device 20 may include a processor and a memory to carry out such computing functions. Computing device 20 may be in the form of a smart phone, a laptop computer, a notebook computer, a desktop computer, a tablet computer, a network component, a server, a network component such as an access point, router, switch, branch, modem or other similar electronic devices that carry out computing functions. Computing device 20 comprises housing 24, inner panel 28 and actuator 32.

Housing 24 comprises a structure enclosing internal electronic components or computer components of computing device 20, such as memory components, processor components, switches and the like. Housing 24 may be formed from a number of walls or panels that are joined to one another so as to substantially enclose such components. Housing 24 comprises an outer panel 34 that comprises an array 36 of openings 38. Openings 38 extend completely through outer panel 34 from an exterior of computing device 20. Although openings 38 are illustrated as having a uniform size and as being equally spaced from one another, in other implementations, openings 38 may have different sizes and different spacings relative to one another. Although array 36 of openings 38 is illustrated as extending along the top wall of housing 24, in other implementations, array 36 of openings 38 may extend along a side or multiple sides of housing 24, along the bottom of housing 24 or along multiple faces of housing 24. In one implementation, outer panel 34 is stationary or fixed. In some implementations, outer panel 34 may be movable.

Inner panel 28 comprises a panel that extends generally opposite and parallel to outer panel 34 along the face of panel 34 that faces the interior of housing 24. Inner panel 28 comprises two arrays of openings: an array 42 of openings 44 and an array 46 of openings 48. Arrays 42 and 46 have different characteristics. In the example illustrated, openings 44 and 48 of arrays 42 and 46, respectively, extend completely through inner panel 28 and have different sizes. In the example illustrated, openings 44 are larger than openings 48. In the example illustrated, openings 44 are larger than corresponding openings 38 while openings 48 are smaller than corresponding openings 38 of outer panel 34. As a result, when openings 44 are positioned in complete alignment with openings 38, openings 38 are completely unoccluded or unblocked. In contrast, when openings 48 are positioned in complete aligned with openings 38, openings 38 are still partially unoccluded or blocked.

Inner panel 28 is movably supported within housing 24 and along outer panel 34. In one implementation, inner panel 28 is slidable relative to outer panel 34. In one implementation, inner panel 28 is movably supported by a pair of opposite rails or tracks formed along the inside of housing 24. Arrays 42 and 46 are located and inner panel 28 is movable relative to outer panel 34 such that the openings of arrays 42 and 46 may be selectively positioned in some form of alignment with openings 38. In one implementation, inner panel 28 is movable through a continuum of locations such that the degree of alignment may be continuously varied to vary, across a continuum, the extent to which openings 38 of array 36 are blocked by the imperforate portions of inner panel 28. In another implementation, inner panel 28 is movable between a plurality of discrete, predefined positions relative to outer panel 34.

Actuator 32 comprises a device to move inner panel 28 between and to various selected venting states. Actuator 32 is operably coupled to inner panel 28, such as by direct physical interaction or by force transmitting fields. In one implementation, actuator 32 comprises an electrically powered actuator such as a worm gear given by an electric motor and a corresponding gear coupled to inner panel 28. In another implementation, actuator 32 comprises an electric solenoid connected to inner panel 28. In yet another implementation, actuator 32 may comprise a magnet coupled to one of inner panel 28 and actuator 32 and a second magnet or a magnetic attractable material, such as a ferrous material coupled to the other of inner panel 28 and actuator 32, wherein the magnet, such as an electromagnet, is selectively actuatable to move inner panel 28 against a provided bias, such as a compression spring or tension spring connected between inner panel 28 and a chassis, frame or housing 24 of computing device 20, between various venting positions and corresponding venting states. In one implementation, actuator 32 may comprise a magnet or magnetically attractable material carried by inner panel 28, wherein actuator 32 comprises a number of independently and selectively actuatable electromagnets which may be selectively actuated to attract the magnet carried by inner panel 28 to a selected one of venting positions.

FIGS. 1A-1D illustrate computing device 20 with inner panel 28 actuated to different venting states by actuator 32. FIG. 1A illustrates inner panel 28 actuated or moved to a fully venting position or state 60 in which each of openings 44 of array 42 are in complete and centered alignment with openings 38 of outer panel 34. In the fully venting position or state 60 shown, openings 38 are completely un-blocked to provide a larger cross-sectional area passage to the interior of housing 24 for enhanced cooling or discharge of heat from the interior of housing 24. In the fully venting position or state 60 shown, inner panel 28 is generally not viewable through openings 38 of outer panel 34 from the exterior computing device 20.

Figure 1B:
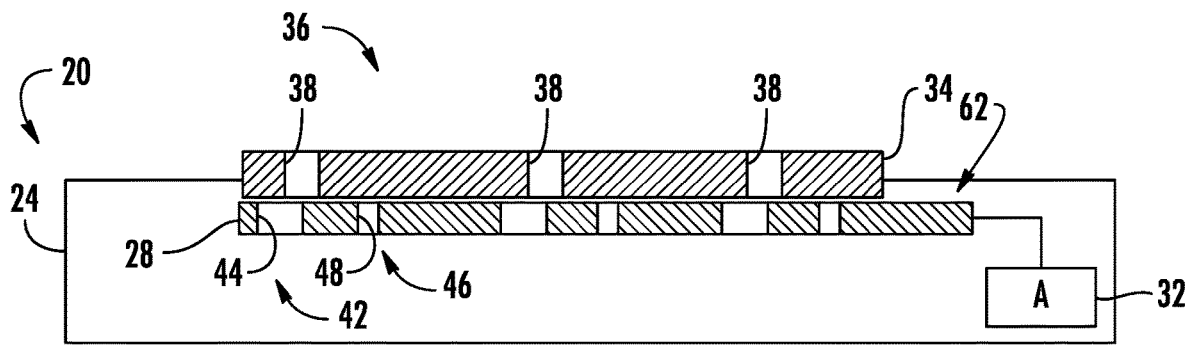
FIG. 1B is a sectional view schematically illustrating portions of the example computing device of FIG. 1A with the inner panel in a second venting position.

FIG. 1B illustrates inner panel 28 actuated or moved to a second venting position 62 in which array 42 of openings 44 is in alignment with openings 38, albeit partial alignment in which a portion of each openings 44 is often overlapping with a corresponding opening 38 and in which imperforate portions of inner panel 28 extend opposite to and may be seen through openings 38. In some implementations, inner panel 28 may be moved to the venting position 62 when computing device 20 is to undergo a lesser degree of cooling as compared to venting position 60.

Figure 1C:
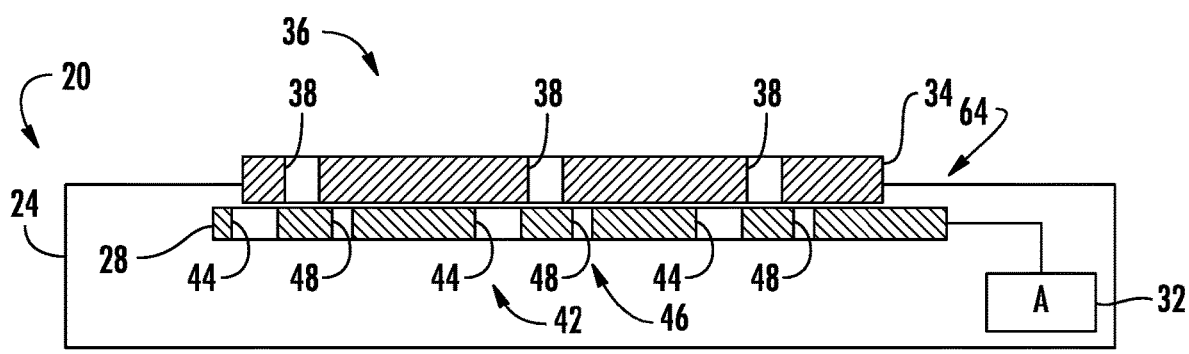
FIG. 1C is a sectional view schematically illustrating portions of the example computing device of FIG. 1A with the inner panel in a non-venting position.

FIG. 1C illustrates inner panel 28 actuated or moved to a non-venting position 64 in which array 42 of openings 44 and array 46 of openings 48 are both out of alignment with openings 38 such that each openings 38 is completely blocked, overlapped by imperforate portions or regions of inner panel 28. In such positions, airflow (possibly containing dust and other contaminants) into the interior of housing 24 through openings 38 is reduced, restricted or limited. In some implementations, inner panel 28 may be moved to the venting position 64 when computing device 20 is not operating or wherein computing device 20 is not undergoing cooling or is undergoing lesser degrees of cooling.

Figure 1D:
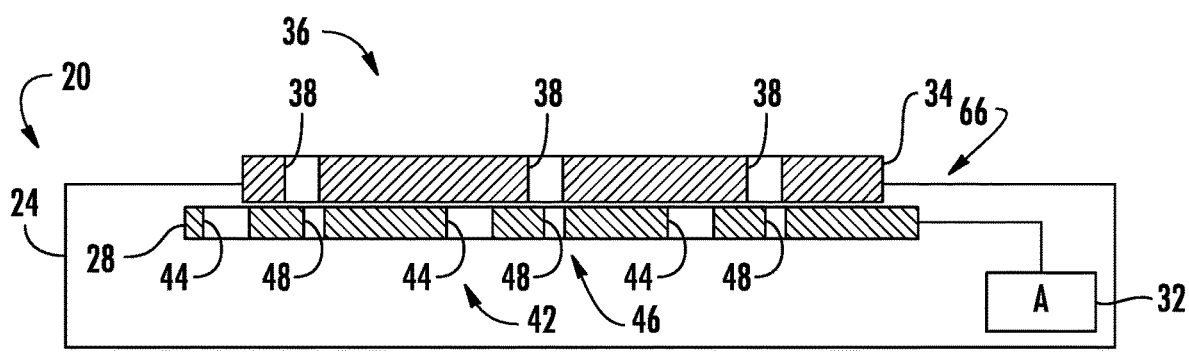
FIG. 1D is a sectional view schematically illustrating portions of the example computing device of FIG. 1A with the inner panel in a third venting position.

FIG. 1D illustrates inner panel 28 actuated or moved to a third venting position 66 in which array 42 openings 44 is out of alignment with array 36 of openings 38 while array 46 openings 48 are in complete alignment with array 36 of openings 38. Openings 48 are smaller than openings 38 such that openings 38 completely surround openings 48, wherein imperforate portions of inner panel 28 on opposite sides of each openings 48 partially block and may be seen through a corresponding opening 38. In some implementations, inner panel 28 may be moved to the venting position 66 when some venting is desired, but to a lesser degree of venting as compared to venting position 60.

Figure 2:
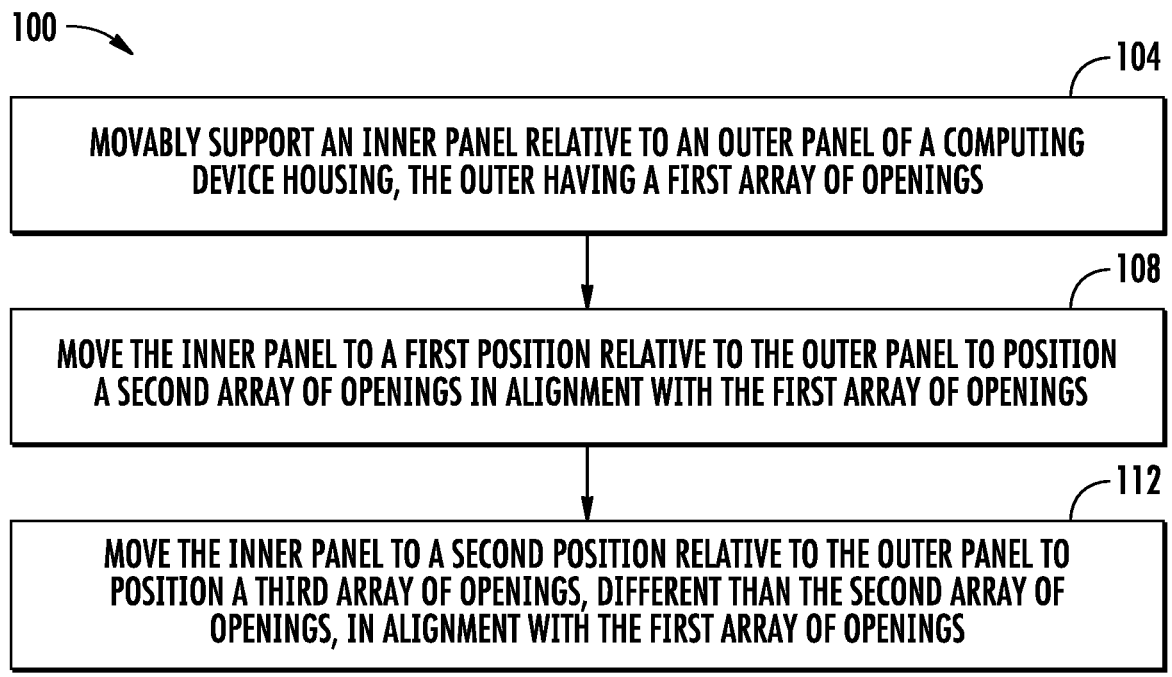
FIG. 2 is a flow diagram of an example method for venting a computing device.

FIG. 2 is a flow diagram of an example computing device venting method 100. Venting method 100 provides multiple different airflow options for venting the interior of a computing device to accommodate different environments, different cooling demands and different aesthetic preferences. For purposes of this disclosure, method 100 is described in the context of being carried out by computing device 20. It should be appreciated that method 100 may likewise be carried out with other computer computing devices disclosed herein or with other similar computing devices.

As indicated by block 104, an inner panel, such as inner panel 28, is movably supporting relative to an outer panel, so as the outer panel 34 of a computing device housing, such as housing 24. The outer panel has a first array of openings, such as array 36, of openings 38.

As indicated by block 108, the inner panel is moved to a first position relative to the outer panel to position a second array of openings, such as array 42 of openings 44, in alignment with the first array of openings. In such a position, the inner panel and the outer panel cooperate to form a first set of airflow passages venting the interior of the computer device.

As indicated by block 112, the inner panel is moved to a second position relative to the outer panel so as to position a third array of openings, such as array 46 of openings 48, different than the second array of openings, in alignment with the first array of openings. In such a position, the inner panel and the outer panel cooperate to form a second set of airflow passages venting the interior of the computer device. The second set of airflow passages have different airflow characteristics as compared to the first set of airflow passages to accommodate different environments, different cooling demands and different aesthetic preferences.

Figure 3A:
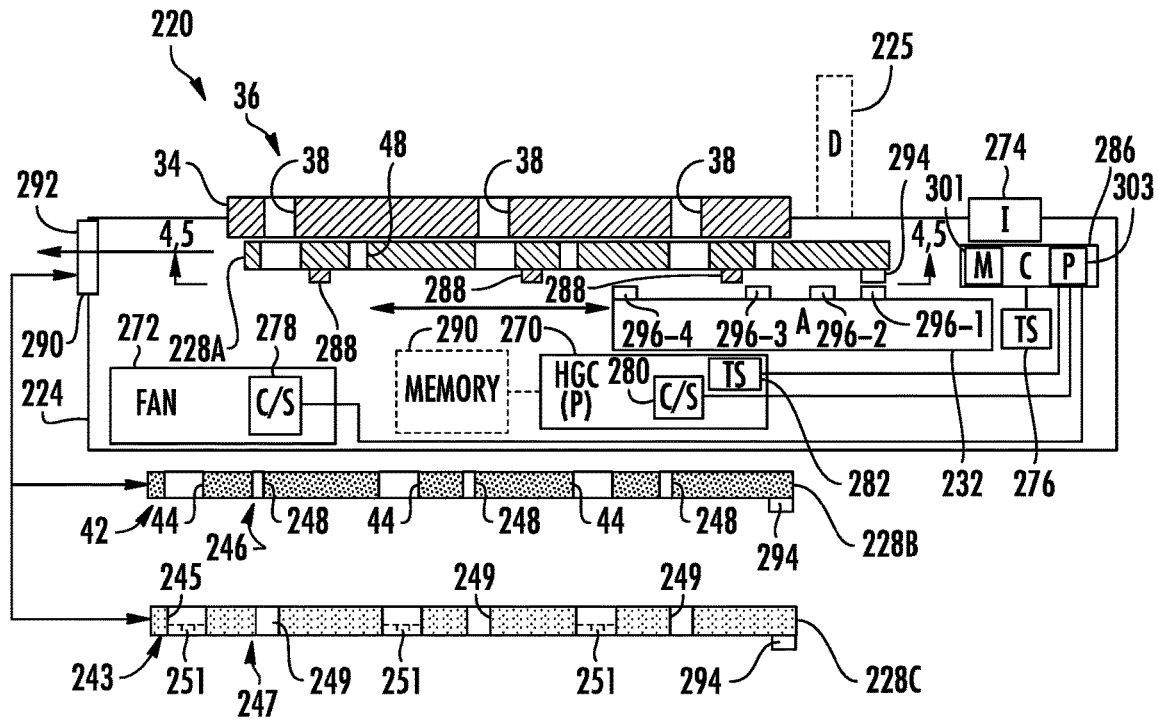
FIG. 3A is a sectional view schematically illustrating portions of an example computing device with an example inner panel in a venting position.

FIG. 3A is a sectional view schematically illustrating portions of an example computing device 220. As with computing device 20 described above, computing device 220 provides multiple different airflow options for venting the interior of a computing device to accommodate different environments, different cooling demands and different aesthetic preferences. Computing device 220 additionally provides automated actuation to different venting positions or states. Computing device 220 additionally provides for customizable venting of computing device 220 in that a person may interchange inner panels having different arrays of openings and/or appearances to even more precisely customize such venting to environmental conditions, operating conditions and aesthetic preferences.

Computing device 220 may have a variety of forms and specific functions in addition to providing a computation or processing of data. Computing device 220 may include a processor and a memory to carry out such computing functions. Computing device 220 may be in the form of a smart phone, a laptop computer, a notebook computer, a desktop computer, a tablet computer, a network component, a server, a network component such as an access point, router, switch, branch, modem or other similar electronic devices that carry out computing functions. Computing device 220 comprises housing 224, inner panels 228A, 228B, 228C (collectively referred to as inner panels 228), actuator 232, heat generating component 270, fan 272, input 274, temperature sensor 276, fan controller/sensor 278, heat generating component controller/sensor 280, heat generating component temperature sensor 282 and controller 286.

Housing 224 comprises a structure enclosing internal electronic components or computer components of computing device 220, such as memory components, processor components, switches and the like. Housing 224 may be formed from a number of walls or panels that are joined to one another so as to substantially enclose such components. As illustrated by broken lines, in some implementations, housing 224 may support or incorporate a display screen 225. In one implementation, the display screen 225 may itself form an exterior of housing 224. In another implementation, display screen 225 may be pivotably supported relative to housing 224.

Housing 224 comprises outer panel 234, inner panel support structures 288, access opening 290 and access panel 292. Outer panel 234 forms an exterior of computing device 220 and comprises an array 36 of openings 38 (described above). Openings 38 extend completely through outer panel 34 from an exterior computing device 220. Although openings 38 are illustrated as having a uniform size and as being equally spaced from one another, in other implementations, openings 38 may have different sizes and men different spacings relative to one another. Although array 36 of openings 38 is illustrated as extending along the top wall of housing 24, in other implementations, array 36 of openings 38 may extend along a sides or multiple sides of housing 24, along the bottom of housing 24 or along multiple faces of housing 24. In one implementation, outer panel 234 is stationary or fixed. In some implementations, outer panel 234 may be movable.

Figure 3B:
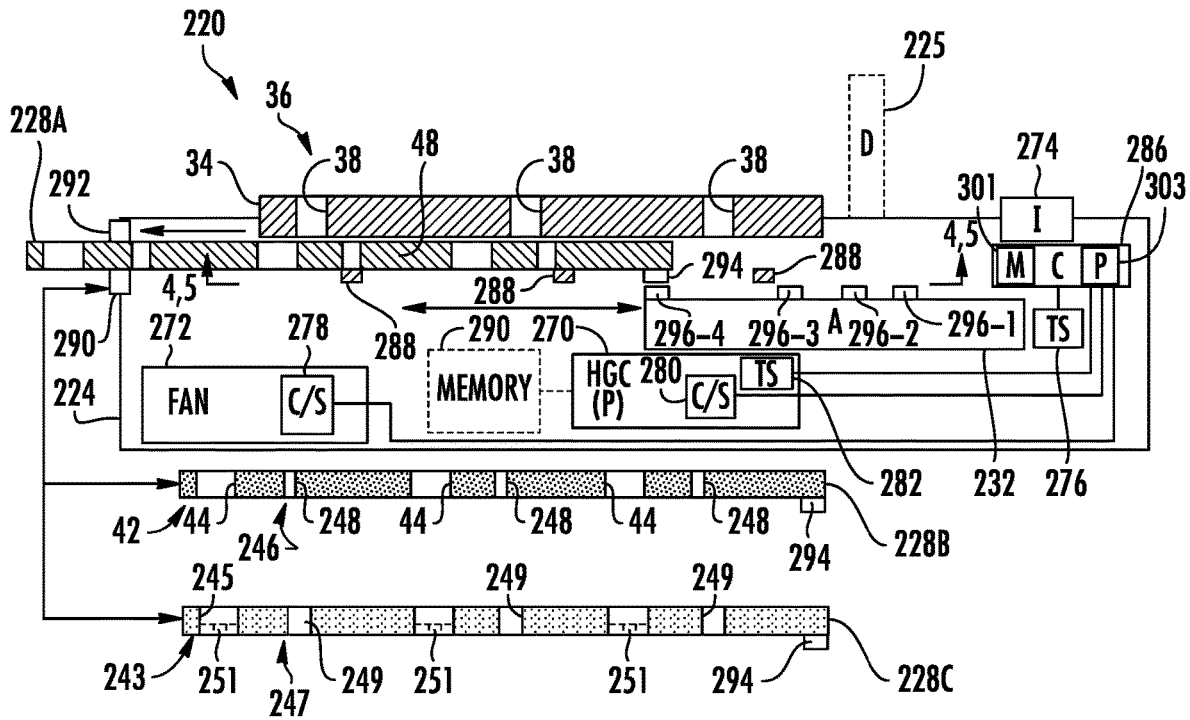
FIG. 3B is a sectional view schematically illustrating portions of the example computing device of FIG. 3A with the example inner panel in a withdrawal position.

Inner panel support structures 288 comprise structures that movably support and/or guide a received inner panel, such as one of inner panel 228 (or inner panel 428 described later). In one implementation, inner panel support structures 288 comprise a series of cantilevered tabs, bars or fingers projecting from opposite sidewalls of housing 24 so as to underlie and slidably support or guide a received inner panel. Such structures 288 form a track or channel in which one of the inner panel 228 may be slidably received. Such fingers are spaced to reliably support an inner panel and not interfere with the slidable insertion or removal of the inner panel. Although FIG. 3 illustrates three pairs of such support structures 288, in other implementations, other arrangements or numbers of support structures 288 may be employed. In yet other implementations, inner panel support structures to 228 may comprise roller bearings, ball bearings, low friction surfaces and the like to further facilitate insertion, removal and movement of a received inner panel.

Access opening 290 comprise an opening along the exterior of housing 224 sized and located such that a received inner panel, such as one of inner panels 228 may be inserted through the opening into the interior of housing 224 and between support structures 288 and outer panel 34. Opening 290 is sized and located such that a received inner panel may be withdrawn from housing 224 through the opening 290. In the example illustrated, access opening 290 may be covered or concealed by access door 292. Access door 292 comprises a panel which may be removably positioned across opening 290. In one implementation, access door 292 may pivot between an open state and a closed state. In another implementation, access door 292 may be completely removed from opening 290, wherein access door 292 is removably snapped in place or retained in place by a fastener. In other implementations, access door 292 may be omitted.

Inner panels 228 each comprise a panel that is sized and shaped so as to be inserted through the access opening 290 into a supported relationship with respect to support structures 288 generally opposite and parallel to outer panel 34 along the face of panel 34 that faces the interior of housing 224. Each of inner panels 228 comprises two arrays of openings. In other implementations, each of inner panels 228 may comprise more than two arrays of openings.

Inner panels 228 are each interchangeable with one another in computer device 220. Inner panels 228 are dissimilar with respect to one another to provide different customized characteristics. In the example illustrated, inner panel 228A is similar to inner panel 28 described above except that inner panel 228A carries or incorporates a magnet 294 as part of the specific example implementation of actuator 232 being illustrated. Magnet 294 comprises a magnetic material, such as a ferrous material. Although illustrated as projecting from the remaining portion of panel 228A, in other implementations, magnet 294 may be embedded within panel 228A or integrally formed as part of panel 228A.

As with panel 28, panel 228A comprises an array 42 of openings 44 and an array 46 of openings 48. Arrays 42 and 46 have different characteristics. In the example illustrated, openings 44 and 48 of arrays 42 and 46, respectively, extend completely through inner panel 28 and have different sizes. In the example illustrated, openings 44 are larger than openings 48. In the example illustrated, openings 44 are larger than corresponding openings 38 while openings 48 are smaller than corresponding openings 38 of outer panel 34. As a result, when openings 44 are positioned in complete alignment with openings 38, openings 38 are completely unoccluded or unblocked. In contrast, when openings 48 are positioned in complete alignment with openings 38, openings 38 are still partially blocked.

Inner panel 228A is movably supported within housing 224 and along outer panel 234. In one implementation, inner panel 228 is slidable relative to outer panel 234. In one implementation, inner panel 228 is movably supported by support structures 288. Arrays 42 and 46 are located and inner panel 228A is movable relative to outer panel 234 such that the openings of arrays 42 and 46 may be selectively positioned in some form of alignment with openings 38 (as shown in FIGS. 1A-1D). In one implementation, inner panel 228A is movable through a continuum of locations such that the degree of alignment may be continuously varied to vary, across a continuum, the extent to which openings 38 of array 36 are blocked by the imperforate portions of inner panel 228A. In another implementation, inner panel 228A is movable between a plurality of discrete, predefined positions relative to outer panel 34.

FIG. 4 illustrates one example of array 36 of openings 38 and one example of each of arrays 42 and 46 of openings 44 and 48, respectively. FIG. 4 is taken from the inside of housing 224 along lines 4,5 of FIG. 3. In the example illustrated, array 36 of openings 38 comprise three elongated openings that are each sized to extend opposite to and across an entire column or portions of an entire column of arrays 42 and 46. Although illustrated as being rectangular, such openings 38 may be oval, round or have other shapes. As should be appreciated, panel 34 may include a greater or fewer number of such openings 38. Such individual openings 38 may encompass or extend opposite to a greater or fewer of such openings of either of arrays 42 and 46.

In the example illustrated, array 42 of openings 44 comprises three columns, with each column comprising three openings 44. In a similar fashion, array 46 of openings 48 comprises three columns, with each column comprising three openings 48. In other implementations, arrays 42 and 46 may have other layouts of openings. For example, rather than being arranged in columns, such openings may be arranged in staggered patterns or other patterns. In other implementations, each of arrays 42 and 46 may comprise a greater or fewer of such openings in a column, in a staggered pattern or in other patterns.

Figure 4A:
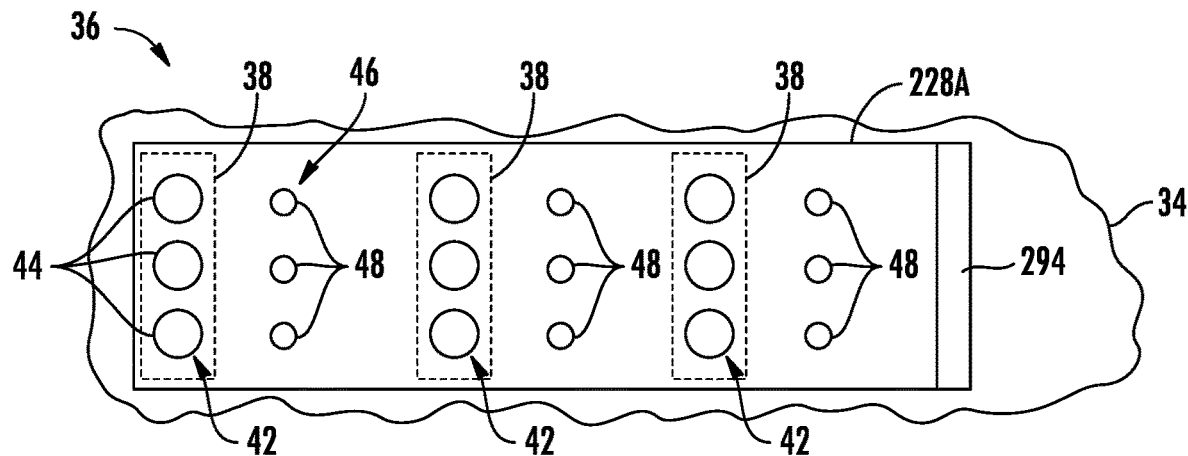
FIG. 4A is a fragmentary plan view of portions of the example computing device of FIG. 3 taken along line 4,5-4,5, illustrating an example inner panel in a first venting position.
Figure 4B:
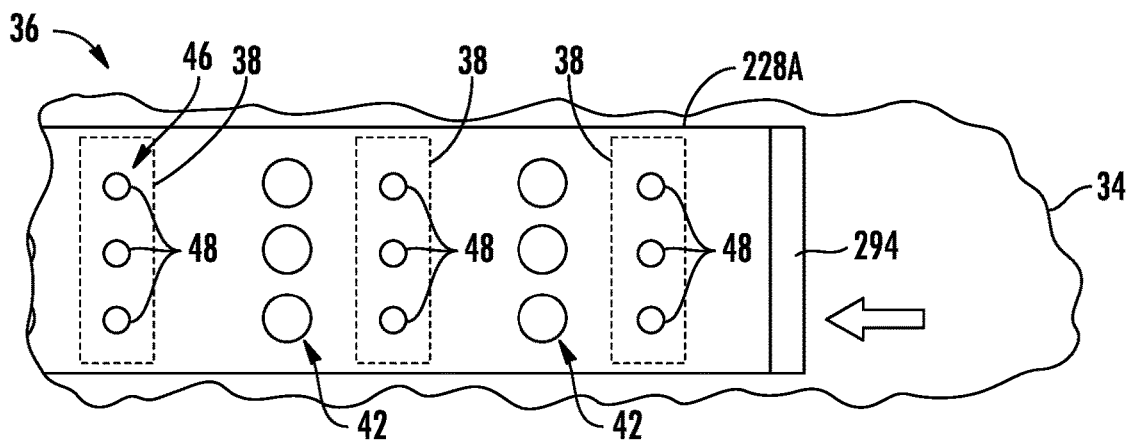
FIG. 4B is a fragmentary plan view of portions of the example computing device of FIG. 4A points illustrating the example inner panel in a second venting position.

FIG. 4A illustrates panel 228A moved by actuator 232 to a position so as to align array 42 of openings 44 with array 36 of openings 38. In the example illustrated, each of openings 38 of array 36 overlies or uncovers multiple openings 44 of array 42 when array 42 is aligned with array 36. Likewise, as shown by FIG. 4B, when actuator 232 has positioned inner panel 228A to align array 46 with array 36, each column of openings 48 of array 46 is also completely exposed through a corresponding opening 38 of array 36.

Figure 5A:
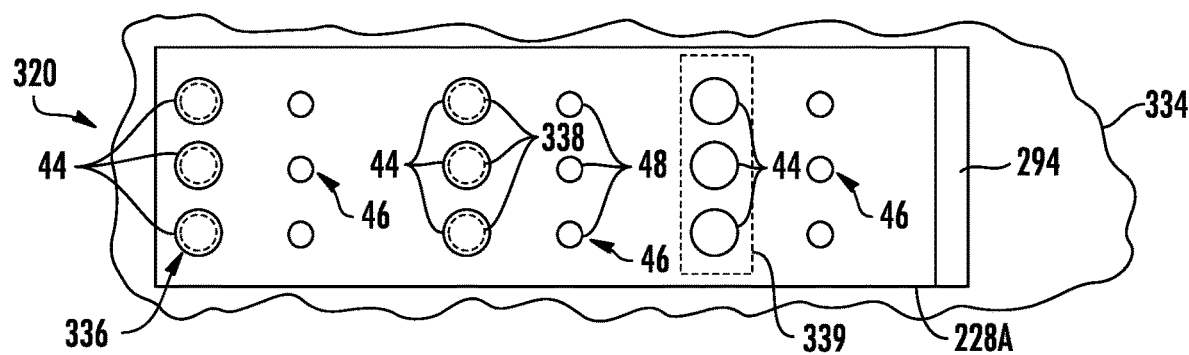
FIG. 5A is a fragmentary plan view of portions of an example computing device with an example inner panel in a first venting position.
Figure 5B:
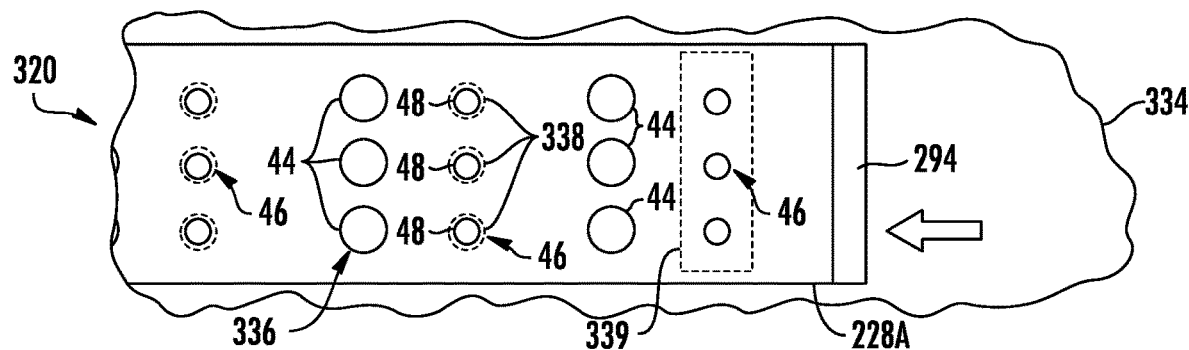
FIG. 5B is a fragmentary plan view of portions of the example computing device of FIG. 5A with the example inner panel in a second venting position.

FIG. 5A illustrates portions of an example computer device 320. Computer device 320 is similar to computer device 220 in all respects except that computing device 320 comprises outer panel 334 as part of its housing 224 and place of outer panel 34. Those remaining components of computing device 320 are numbered similarly in FIG. 5A or are shown in FIG. 3. Outer panel 334 is similar to outer panel 34 described above except that outer panel 334 comprises an array 336 of openings 338 and 339. Openings 338 comprise individual, spaced openings, each of openings 338 corresponding to one of openings 44 and one of openings 48 of arrays 42 and 46, respectively. In the example illustrated, each of openings 338 is sized smaller than the size of the corresponding opening 44 and larger than the corresponding opening 48. As a result, when actuator 232 has array 42 center aligned with array 336, openings 44 encompass openings 338 such that the entire area of each of openings 338 is unblocked or open. As shown by FIG. 5B, when actuator 232 has array 46 center aligned with array 336, openings 48 are surrounded by openings 338 such that portions of openings 338 are blocked by the imperforate portions of inner panel 228A along the perimeter edges of openings 48.

In the example illustrated, outer panel 334 is a hybrid panel in that array 336 also includes openings that are larger and concurrently alignable with multiple openings of inner panel 228A. In particular, outer panel 334 comprises opening 339 which is similar to opening 38. As a result, inner panel 228A may be positioned so as to locate multiple openings 44 or multiple openings 48 opposite to opening 339, depending upon the selected venting position. In other implementations, array 336 may omit opening 339 and include another column of openings 338 in place of opening 339.

Actuator 232 comprises a device to move inner panels 228 between and to various selected venting states. Actuator 232 is operably coupled to a selected inner panel 228. In the example illustrated, actuator 232 comprises an electrically powered actuator in the form of multiple spaced electromagnets 296-1, 296-2, 296-3 and 296-4. Each of electromagnets 296 is independently activatable and has sufficient magnetic strength so as to attract magnet 294 of the inserted inner panel 228 into close proximity with the activated or powered electromagnet 296. In the example illustrated, electromagnet 296-1 may be activated or powered to attract magnet 294 to position inner panel 228 to the venting position shown in FIG. 3A in which array 42 of openings 44 is in alignment with array 36 of openings 38. Electromagnet 296-2 may be activated or powered to attract magnet 294 to position inner panel 228 to the venting position shown in FIG. 1C, in which neither of arrays 42 or 46 are in alignment with array 36, resulting in imperforate portions of inner panel 228, occluding or blocking the openings 38 of array 36. Electromagnet 296-3 may be activated or powered to attract magnet 294 to position inner panel 228 to the venting position shown in FIG. 1D, in which openings 48 of array 42 are aligned with openings 38 of array 36. Electromagnet 296-4 may be activated or powered to attract magnet 294 to position inner panel 228 to a discharge or withdrawal position shown in FIG. 3B such that inner panel 228 is positioned in close proximity to access opening 290, permitting the gripping of inner panel 228 for its withdrawal through access opening 290. In some implementations, an end portion of the received inner panel 228 may project through access opening 290, possibly pivoting door 292 to an open position, when moved to the withdrawal position. In some implementations, pairs of consecutive electromagnets 296 may be concurrently activated or powered to attract magnet 294 to intermediate positions between the electromagnets to achieve other positions for inner panel 228, such as an intermediate position as shown in FIG. 1B.

In yet other implementations, actuator 232 may have other forms such as a worm gear driven by an electric motor and a corresponding gear coupled to inner panel 228. In another implementation, actuator 232 comprises an electric solenoid having a piston connected to inner panel 228. In yet another implementation, actuator 232 may comprise a magnet coupled to one of inner panel 228 and actuator 232 and a second magnet or a magnetic attractable material, such as a ferrous material coupled to the other of inner panel 228 and actuator 232, wherein the magnet, such as an electromagnet, is selectively actuatable to move inner panel 228 against a provided bias, such as a compression spring or tension spring connected between inner panel 28 and a chassis, frame or housing 224 of computing device 220, between various venting positions and corresponding venting states. In each of such cases, the received inner panel 228 is releasably connected to actuator 232 to facilitate the removal and replacement of the inner panel 228. In other implementations where interchangeable inner panels are not provided, inner panel 228A may be fixedly connected to actuator 232.

Inner panels 228B and 228C are each similar to and interchangeable with inner panel 228A within computing device 220 through access opening 290. Inner panels 228B and 228C each have different characteristics. In the example illustrated, inner panel 228B is similar to inner panel 228A except that inner panel 228B provides a different, customized aesthetic and a different array of vent openings. Inner panel 228B has a different color, texture or surface pattern (as schematically illustrated by the depicted texture or hatching) as compared to inner panel 228A, such that when imperforate portions of inner panel 228B are viewable through openings 38 (or openings 338, 339), the exterior housing of computing device to 220 may be provided with a different aesthetic or appearance. Inner panel 228B comprises an array 246 of openings 248 in place of array 46 of openings 48. Array 246 has a similar layout to that of array 46, but where openings 248 are each smaller in diameter than each of openings 48. As a result, when inner panel 228B is positioned to align openings 248 with openings 38, the smaller air passages provide venting, but to a lesser degree as compared to the larger air passages formed by the alignment of openings 48 with openings 38.

Inner panel 228C is similar to inner panel 228A and 228B except that inner panel 228C provides a different, customized aesthetic and a different array of vent openings. Inner panel 228C has a different color, texture or surface pattern (as schematically illustrated by the depicted texture or hatching) as compared to inner panels 228A, 228B, such that when imperforate portions of inner panel 228C are viewable through openings 38 (or openings 338, 339), the exterior housing of computing device 220 may be provided with a different aesthetic or appearance. Inner panel 228C comprises arrays 243 and 247 of openings 245 and 249, respectively, in place of arrays 42 of openings 44 and arrays 46 of openings 48, respectively.

Array 243 has a similar layout as compared to array 42, but where the individual openings 245 are filtered by filter material 251. Filter material 251 may comprise a mesh, fabric or other air transmitting, imperforate structure spans across and within the interior of each of openings 245. Filter material 251 may further restrict the ingress of dust and other contaminants of permitting some degree of airflow.

Array 247 has a similar layout or pattern of openings as compared to array 46. However, openings 249 of array 247 are larger than openings 48 and smaller than openings 44. Openings 249 provide a different degree of venting or airflow as compared to the other arrays of inner panels 228.

Overall, the exchangeability of inner panels 228 allow a person to exchange such inner panels 228 to provide computing device 220 with the customized exterior appearance as seen through openings 38 (or openings 338, 339). In addition, the exchangeability of inner panels 228 facilitate the provision of vent openings having sizes and layouts best suited for a particular environmental condition or particular venting/cooling demands of computing device 220.

Heat generating component 270 comprise an internal component of computing device 220 which outputs heat. In one implementation, heat generated component 270 comprises a processor or processing unit having and associated memory (non-transitory computer-readable medium) 298 (shown in broken lines). Fan 272 is located within the interior of housing 224 and generates airflow to facilitate dissipation of heat from heat generated component 270.

Input 274 comprises a mechanism by which a person or a user of computing device 220 may input selections and commands. In one implementation, input, 274 may comprise a keyboard, touchpad, mouse, touchscreen or a microphone with associated speech recognition software. In some implementations, input, 274 may be incorporated into display screen 225 as part of a touchscreen.

Temperature sensor 276 comprises a sensor that senses an internal temperature within the housing 224. Temperature sensor 276 may include multiple temperature sensing elements located throughout the interior of housing 224. Temperature sensor 276, outputs signals to controller 286, which may be utilized by controller 286 to make determinations regarding the positioning of the received inner panel 228A, 228B, or 228C.

Fan controller/sensor 278 comprises an electronic device that outputs or detects a current state of fan 272. For example, in one implementation, fan 272 may have a controller that may output its state such as its speed, on-off state, power draw, and the like. In another implementation, fan 272 may omit such a controller, but include a sensor that detects the speed or power draw of fan 272. The detected state of fan 272 may be transmitted to controller 286 for making determinations regarding the positioning of the received inner panel.

Heat generating component controller/sensor 280 comprises an electronic device that outputs or detects a current state of heat generating component 270. For example, in one implementation, heat generating component 270 may have a controller that may output its state such as CPU usage, on-off state and the like. In another implementation, heat generating component, controller/sensor 280 may omit such a controller, but include a sensor that detects the state of heat generating component 270. The detected state of heat generating component 270 may be transmitted to controller 286 for making determinations regarding the positioning of the received inner panel.

Temperature sensor 282 comprises a temperature sensing element are multiple temperature sensing elements that are specifically located to sense the specific temperature of heat generating component 270. Signals indicating the temperature of heat generating component to earn 70 may be transmitted to controller 286. Controller 286 may utilize such signals to determine whether the temperature of heat generating component 270 may be too high and make the further determination regarding the appropriate positioning of the received inner panel.

Controller 286 comprises a non-transitory computer-readable medium 301, such as a memory, and a processor 303 which follows instructions contained in the medium 301. Controller 286 receives signals from each of input, 274, temperature sensor 276, fan controller/sensor 278, heat generated component, controller/sensor 280 and heat generating component temperature sensor 282. Based upon such signals, controller 286 may determine an appropriate venting position for a received inner panel 228A, 228B or 228C. For example, upon determining high temperatures within housing 224, controller 286 may determine that the larger openings of the inner panel should be aligned with the openings of outer panel 34, 334 to provide larger airflow passages and greater venting. Conversely, upon determining that computing device 220 is about to be shut down or is operating at low temperatures, controller 286 may determine that the smaller openings of the inner panel or imperforate portions of the inner panel should be aligned with the openings of outer panel 34, 334 to provide smaller or no airflow passages to inhibit the ingress of dust and contaminants. Such a determination may be made by controller 286 consulting a lookup table having particular temperatures associated with particular positions for the received inner panel. Such a determination may be made by controller 286 using the sensed temperature, as a factor in a formula for calculating an amount of venting and a corresponding position for the received inner panel.

In one implementation, the determined position for the received inner panel may be based upon a combination of signals from each of the aforementioned sensors (temperature sensor 276, controller/sensor 278, controller/sensor 280 and temperature sensor 282). In some implementations, the signals from the different sensors may be differently weighted with respect to one another. In other implementations, the determined position for the received inner panel may be based upon a user selected portion of the aforementioned sensors per a predetermined set up by a user of computing device 220.

In one implementation, controller 286 may present the determined position for the received inner panel on display screen 225, prompting a person make a selection or enter a command, whereby controller 286 outputs a control signal to actuator 232 to move the received inner panel to 228 to the selected position. In another implementation, controller 286 automatically outputs control signals to actuator 232 to cause actuator 232 to move the received inner panel to 228 to the determined position in response to the signals received from temperature sensors 276, fan controller/sensor 278, heat generating component, controller/sensor to earn 80 or heat generating component temperature sensor 282.

In some implementations, controller 286 may store an inventory of available interchangeable inner panels 228. In some implementations, controller 286 may prompt a person, via display screen 225, to replace an existing inner panel with an alternative inner panel. In some implementations, controller 286 may utilize the stored inventory to suggest a particular inner panel for use. For example, in response to a detected change in temperature such that a temperature exceeds a predetermined threshold, controller may select an individual particular inner panel, such as panel 228B, and prompt a person on display screen 225 to replace an existing panel 228A with panel 228B. In some implementations, upon determining that an existing or current inner panel should be replaced, controller 286 may output an audible or visual alarm, such as a flashing light or other attention-getting signal, to alert a person that a change in the inner panel is recommended.

Figure 6A:
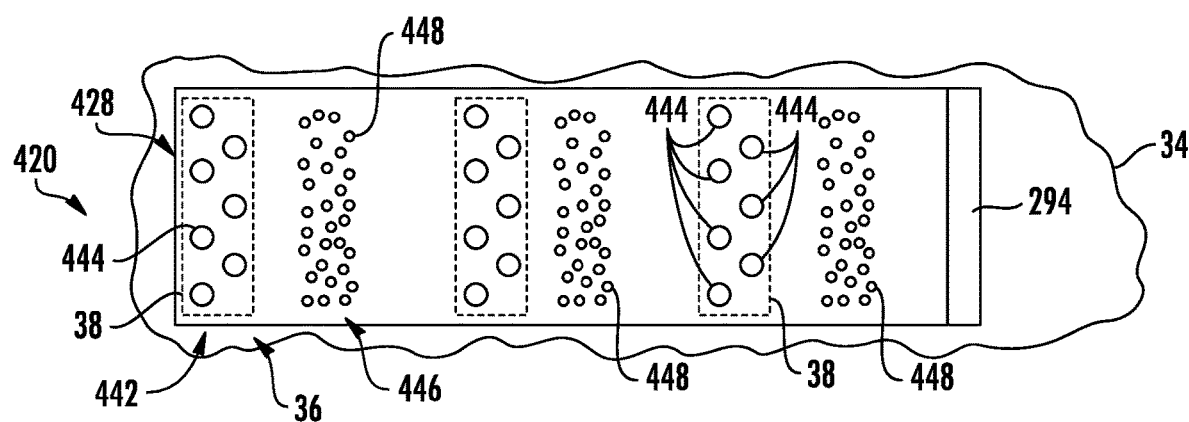
FIG. 6A is a fragmentary plan view of portions of the example computing device of FIG. 3, including a different inner panel and taken along line 4,5-4,5, illustrating an example inner panel in a first venting position.
Figure 6B:
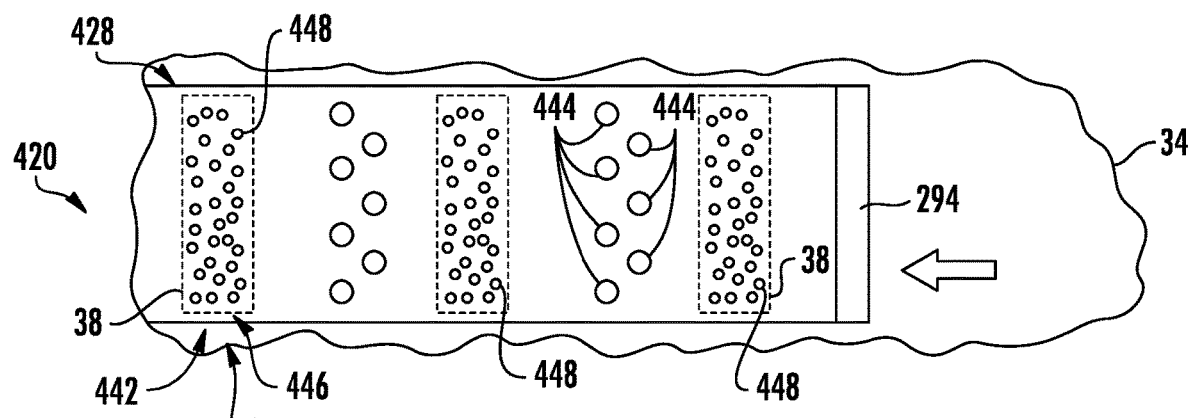
FIG. 6B is a fragmentary plan view of portions of the example computing device of FIG. 6A illustrating the example inner panel in a second venting position.

FIG. 6A illustrates portions of computing device 220 receiving an interchangeable inner panel 428. Those remaining portions of computing device 220 not shown in FIG. 6A are shown in FIG. 3. Interchangeable inner panel 428 comprises arrays 442 of openings 444 and arrays 446 of openings 448. FIG. 6A illustrates the positioning of panel 428 by actuator 232 to align array 442 of openings 444 with array 36. As shown by FIG. 6B, inner panel 428 may be moved by actuator 232 to alternatively align the openings 448 of array 446 with the openings 38 of array 36.

Arrays 442 and 446 are different with respect to one another in that openings 444 of array 442 are each individually larger than the individual openings 448 of array 446. In addition, openings 444 have a different layout as compared to openings 448. Openings 444 are staggered, whereas openings 448 are more randomly distributed. Openings 448 have a greater density of openings per surface area. In other words, the number of openings 448 for a given unit of area is greater. Although openings 444 and 448 are all illustrated as being circular, in other implementations, such openings may have other shapes and sizes. For example, in one implementation, some of the openings of an individual array may be polygonal or in the form of slots.

Although the present disclosure has been described with reference to example implementations, workers skilled in the art will recognize that changes may be made in form and detail without departing from the spirit and scope of the claimed subject matter. For example, although different example implementations may have been described as including features providing one or more benefits, it is contemplated that the described features may be interchanged with one another or alternatively be combined with one another in the described example implementations or in other alternative implementations. Because the technology of the present disclosure is relatively complex, not all changes in the technology are foreseeable. The present disclosure described with reference to the example implementations and set forth in the following claims is manifestly intended to be as broad as possible. For example, unless specifically otherwise noted, the claims reciting a single particular element also encompass a plurality of such particular elements. The terms "first", "second", "third" and so on in the claims merely distinguish different elements and, unless otherwise stated, are not to be specifically associated with a particular order or particular numbering of elements in the disclosure.

What is claimed is:

1. A computing device comprising:
    a housing having an outer panel, the outer panel comprising a first array of openings through the outer panel;
    an inner panel opposite the outer panel, the inner panel comprising a second array of openings and a third array of openings different than the second array of openings;
    an actuator to move the inner panel relative to the outer panel between (1) a first position in which the second array of openings are at least partially aligned with the first array of openings and the third array of openings are out of alignment with the first array of openings, and (2) a second position in which the third array of openings are at least partially aligned with the first array of openings and the second array of openings are out of alignment with the first array of openings.

2. The computing device of claim 1, wherein the openings of the second array are each larger than individual openings of one of the first array of openings and the third array of openings.

3. The computing device of claim 2, wherein the openings of the first array are each larger than individual openings of the second array of openings and the third array of openings.

4. The computing device of claim 1, wherein the openings of the second array each have a first size and wherein the openings of the third array each have a second size different than the first size.

5. The computing device of claim 1, wherein the openings of the second array have a first opening density and wherein the openings of the third array have a second opening density different than the first opening density.

6. The computing device of claim 1 further comprising support structures opposite the outer panel and spaced from the outer panel to form a channel, wherein the inner panel is slidably received within the channel.

7. The computing device of claim 1 further comprising an access opening adjacent and edge of the inner panel, wherein the inner panel is removable through the access opening for replacing the inner panel with a second inner panel having a characteristic different than the inner panel.

8. The computing device of claim 1, wherein the actuator comprises a selectively actuatable magnet to move the inner panel using magnetic forces.

9. The computing device of claim 1, wherein the actuator is to move the inner panel to a third position in which both the second array of openings and the third array of openings are completely offset from the first array of openings.

10. The computing device of claim 1, wherein the inner panel comprises imperforate portions between the second array of openings and the third array of openings and wherein the imperforate portions extend across and occlude the first array of openings when the inner panel is in the third position.

11. The computing device of claim 1 further comprising:
    a temperature sensor to output signals indicating a temperature within the housing; and
    a controller to output control signals controlling the actuator, the control signals being output based upon the temperature within the housing as indicated by the temperature sensor.

12. A method comprising:
    movably supporting an inner panel relative to an outer panel of a computing device housing, the outer having a first array of openings;
    moving the inner panel to a first position relative to the outer panel to position a second array of openings in at least partial alignment with the first array of openings; and
    moving the inner panel to a second position relative to the outer panel to position a third array of openings, different than the second array of openings, in at least partial alignment with the first array of openings.

13. The method of claim 12 further comprising sensing a temperature within the housing, wherein the moving of the inner panel to the first position and the moving of the inner panel to the second position is based upon the sensing of the temperature within the housing.

14. An inner panel for a computing device housing, the inner panel comprising:
    a first array of openings through the inner panel, the inner panel to be movably supported in an interior of the computing device housing;
    a second array of openings extending through the inner panel and distributed amongst the first array of openings, the second array of openings being different than the first array of openings; and
    an actuator that moves the inner panel relative to the computing device housing while in the interior of the computing device housing to partially align the first array of openings with openings in the computing device housing while the second array of openings are out of alignment with the openings in the computing device housing, and to partially align the second array of openings with the openings in the computing device housing while the first array of openings are out of alignment with the openings in the computing device housing.

15. The inner panel of claim 14, wherein the first array of openings has a first opening density and wherein the second array of openings has a second opening density different than the first opening density.

* * * * *